US008176450B1

(12) United States Patent
Van Brink

(10) Patent No.: US 8,176,450 B1
(45) Date of Patent: May 8, 2012

(54) METHOD AND APPARATUS FOR PARAMETERIZING HARDWARE DESCRIPTION LANGUAGE CODE IN A SYSTEM LEVEL DESIGN ENVIRONMENT

(75) Inventor: David Van Brink, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/806,710

(22) Filed: Aug. 19, 2010

Related U.S. Application Data

(62) Division of application No. 11/286,814, filed on Nov. 23, 2005, now Pat. No. 7,793,248.

(51) Int. Cl.
*G06F 17/50* (2006.01)
(52) U.S. Cl. ............................ 716/103; 716/101; 703/14
(58) Field of Classification Search .................. 716/101, 716/103; 703/14
See application file for complete search history.

(56) References Cited

U.S. PATENT DOCUMENTS

| | | | |
|---|---|---|---|
| 5,812,130 A | 9/1998 | Van Huben et al. | |
| 6,094,654 A * | 7/2000 | Van Huben et al. | 1/1 |
| 6,110,223 A | 8/2000 | Southgate et al. | |
| 6,120,549 A | 9/2000 | Goslin et al. | |
| 6,151,567 A * | 11/2000 | Ames et al. | 703/13 |
| 6,173,435 B1 * | 1/2001 | Dupenloup | 716/104 |
| 6,226,780 B1 | 5/2001 | Bahra et al. | |
| 6,272,451 B1 | 8/2001 | Mason et al. | |
| 6,784,903 B2 * | 8/2004 | Kodosky et al. | 715/771 |
| 6,810,482 B1 | 10/2004 | Saxena et al. | |
| 6,848,084 B1 * | 1/2005 | Pandey et al. | 716/107 |
| 6,865,526 B1 * | 3/2005 | Henkel et al. | 703/18 |
| 7,043,415 B1 * | 5/2006 | Dunlavey et al. | 703/12 |
| 7,143,368 B1 | 11/2006 | Plofsky et al. | |
| 7,272,546 B1 | 9/2007 | Brown et al. | |
| 7,290,224 B2 | 10/2007 | Byrn et al. | |
| 7,331,022 B1 | 2/2008 | Pritchard et al. | |
| 7,496,869 B1 * | 2/2009 | Janneck et al. | 716/103 |
| 7,509,246 B1 * | 3/2009 | Molson et al. | 703/13 |
| 7,584,456 B1 * | 9/2009 | Veenstra et al. | 717/124 |
| 7,694,266 B1 * | 4/2010 | Sankaralingam | 716/104 |
| 7,793,248 B1 | 9/2010 | Brink | |
| 7,890,317 B2 * | 2/2011 | Brown et al. | 703/25 |
| 2003/0229482 A1 | 12/2003 | Cook et al. | |
| 2005/0049843 A1 * | 3/2005 | Hewitt et al. | 703/14 |
| 2005/0132306 A1 | 6/2005 | Smith et al. | |
| 2006/0218512 A1 * | 9/2006 | Arslan et al. | 716/4 |
| 2008/0235648 A1 * | 9/2008 | Roesner et al. | 716/18 |

* cited by examiner

*Primary Examiner* — Naum Levin
(74) *Attorney, Agent, or Firm* — L. Cho

(57) ABSTRACT

A method for managing an electronic design automation tool includes importing a component. A graphical user interface is generated to allow a user to enter values for parameters of the component. Other embodiments are disclosed.

20 Claims, 5 Drawing Sheets

METHOD AND APPARATUS FOR PARAMETERIZING HARDWARE DESCRIPTION LANGUAGE CODE IN A SYSTEM LEVEL DESIGN ENVIRONMENT

RELATED APPLICATIONS

This application is a divisional of U.S. application Ser. No. 11/286,814, now U.S. Pat. No. 7,793,248 filed on Nov. 23, 2005 entitled "METHOD AND APPARATUS FOR PARAMETERIZING HARDWARE DESCRIPTION LANGUAGE CODE IN A SYSTEM LEVEL DESIGN ENVIRONMENT".

TECHNICAL FIELD

The present invention relates to the field of electronic design automation (EDA) tools. More specifically, the present invention relates to a method and apparatus for importing a component written in hardware description language (HDL) code into a system level design environment to be used by a system level EDA tool where instances of the component may be parameterized.

BACKGROUND

System level EDA tools allow a designer to model, simulate, and analyze systems. Tools such as SOPC Builder from Altera® Corporation allow designers to create, simulate, evaluate, and refine a system design model through standard and custom block libraries. SOPC Builder from Altera® Corporation provides system-on-a-programmable-chip (SOPC) development tools that interface hardware design flow tools that perform synthesis, placement, and routing.

Tools such as SOPC Builder allow designers to integrate previously created off the shelf components into a system design, create reusable custom components, build an interconnect fabric optimized for requirements of a system design, and generates system test bench suites. When creating a custom component, it may be desirable to allow a user to adjust parameters of an instance of the component when using a system level EDA tool. In the past, a graphical user interface would need to be hand coded by the designer of a particular component in HDL. This proved to be time consuming.

Thus, what is needed is an improved method and apparatus for parameterizing HDL code in a system level design environment.

SUMMARY

A method and apparatus is disclosed for parameterizing HDL code in a system level design environment. According to one embodiment, a graphical user interface is generated to allow a user to enter values for parameters of the component. The graphical user interface is generated by creating a text description of the code for the component, parsing the text description for parameters, and identifying parameters to present in the graphical user interface. By automating this procedure, the component designer need not hand code a graphical user interface for the component.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that these specific details may not be required to practice the embodiments of the present invention. In other instances, well-known components, programs, and procedures may be shown in block diagram form to avoid obscuring embodiments of the present invention unnecessarily.

Figure 1:
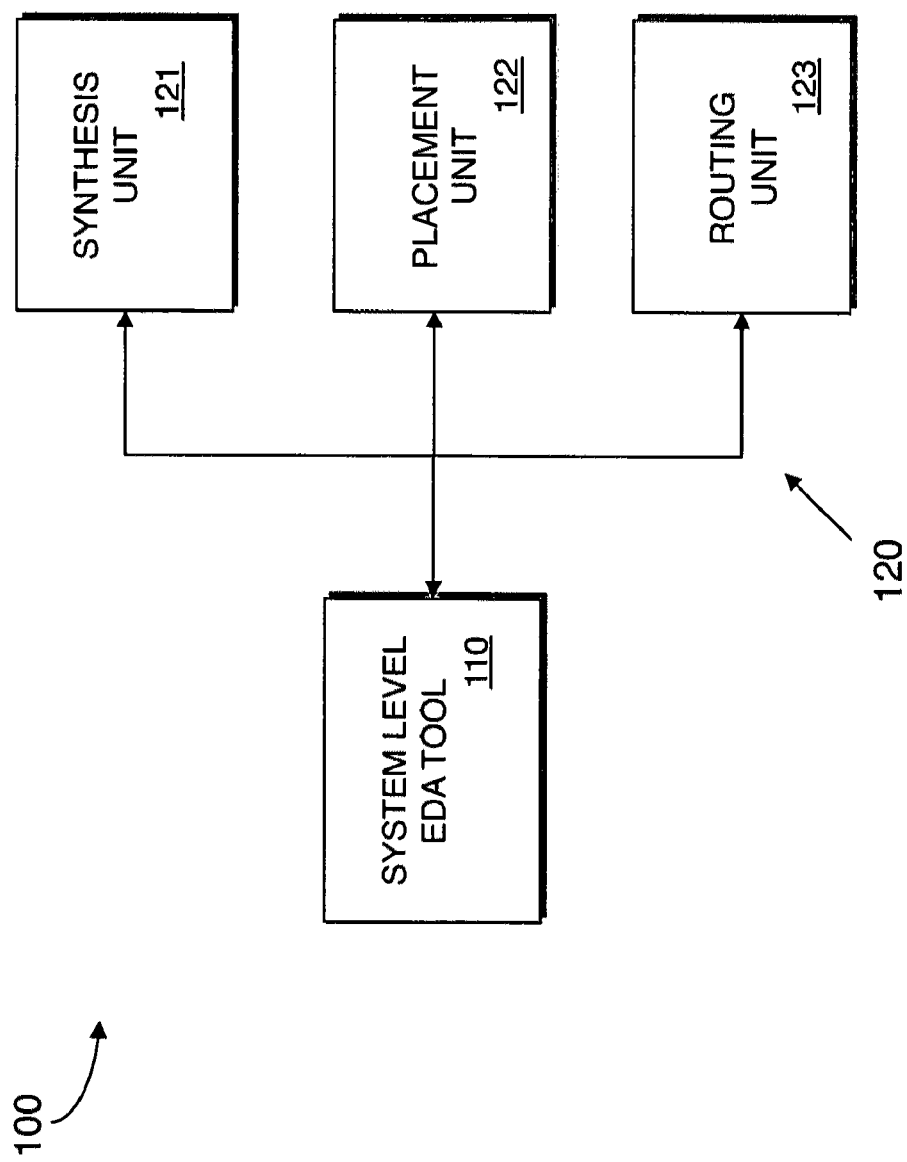
FIG. 1 illustrates a block diagram illustrating EDA tools according to an embodiment of the present invention.

FIG. 1 illustrates a block diagram of EDA tools 100 according to an embodiment of the present invention. The block diagram includes software modules implementing an embodiment of the present invention. According to one embodiment, system design may be performed by a computer system (not shown) executing sequences of instructions represented by the software modules shown in FIG. 1. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

The EDA tools 100 include a system level EDA tool 110 and a hardware design flow tool 120 which together may be used to create a system design model that reflects an abstract level of design of the system. According to an embodiment of the present invention, the system level EDA tool 110 may be a program that models, simulates, and analyzes dynamic systems having outputs that change over time. The system level EDA tool 110 may provide a graphical user interface for building models as block diagrams. The system level EDA tool 110 may include a library of pre-defined (off the shelf) and/or user-defined (custom designed) components that perform general or specific functionalities. The functionalities may include math, logic and bit, communications, signal processing, video and image processing operations. According to one embodiment of the present invention, the system level EDA tool 110 may be implemented by SOPC Builder from Altera® Corporation.

According to an embodiment of the present invention, the hardware design flow tool 120 may be a program that synthesizes, places, and routes circuits on a target device such as a field programmable gate array. The hardware design flow tool 120 includes a synthesis unit 121. The synthesis unit 121 generates a logic design of a system to be implemented by the target device. According to an embodiment of the hardware design flow tool 120, the synthesis unit 121 takes a conceptual Hardware Description Language (HDL) design definition and generates an optimized logical representation of the system. The optimized logical representation of the system generated by the synthesis unit 121 may include a representation that has a minimized number of functional blocks and registers, such as logic gates and logic elements, required for the system. Alternatively, the optimized logical representation of the system generated by the synthesis unit 121 may include a representation that has a reduced depth of logic and that generates a lower signal propagation delay. The synthesis unit 121 also determines how to implement the functional blocks and registers in the optimized logic representation utilizing specific resources on the target device creating an optimized "technology-mapped" netlist. The technology-mapped netlist illustrates how the resources on the target device are utilized to implement the system. The technology-mapped netlist may, for example, contain components such as logic elements (LEs) on the target device.

The hardware design flow tool 120 includes a placement unit 122. The placement unit 122 fits the system on the target device by determining which resources on the target device are to be used for specific functional blocks and registers. According to an embodiment of the hardware design flow tool 120, the placement unit 122 first determines how to implement portions of the optimized logic design in clusters. Clusters may represent a subset of the components on the target device such as, for example, a logic array block (LAB) having 10 LEs. In this embodiment, after portions of the optimized logic design are implemented in clusters, the clusters may be placed by assigning the clusters to specific LABs on the target device. Following the placement of the clusters, routing interconnections between the LEs may be performed. The placement unit 122 may utilize a cost function in order to determine a good assignment of resources on the target device.

The hardware design flow tool 120 includes a routing unit 123. The routing unit 123 determines the routing resources on the target device to use to provide interconnection between the functional blocks and registers on the target device. According to an embodiment of the present invention, the hardware design flow tool 120 may be implemented by Quartus® or Quartus II® from Altera® Corporation.

Figure 2:
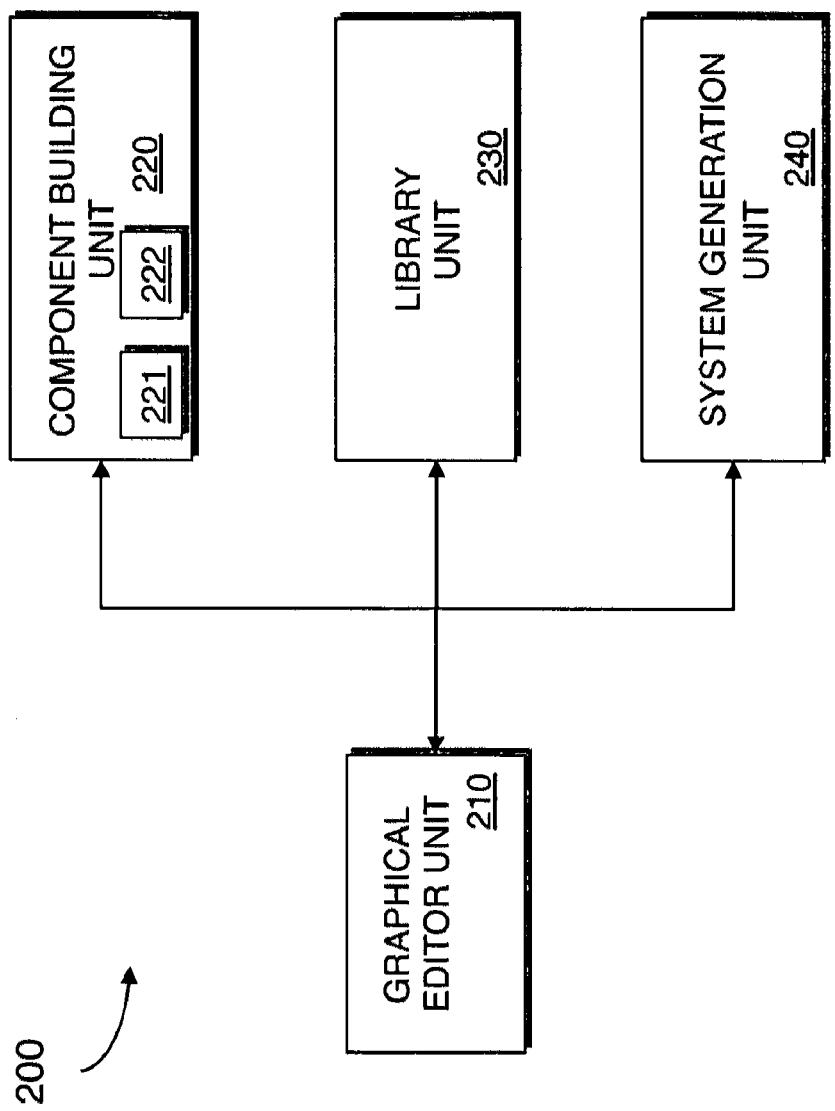
FIG. 2 illustrates a block diagram of a system level EDA tool according to an embodiment of the present invention.

FIG. 2 illustrates a block diagram of a system level EDA tool 200 according to an embodiment of the present invention. The system level EDA tool 200 may be used to implement the system level EDA tool 110 shown in FIG. 1. The system level EDA tool 200 includes a graphical editor unit 210. The graphical editor unit 210 provides a graphical user interface that allows a user to select and connect components to be implemented in a system design. The graphical editor unit 210 is connected to and transmits data between units in the system level EDA tool 200.

The system level EDA tool 200 includes a component building unit 220. The component building unit 220 integrates user defined components into the system level EDA tool 200. The component building unit 220 includes a component import unit 221. The component import unit 221 interfaces with an external source to import custom designed components into the component building unit 220. The custom designed components may be written in a hardware description language (HDL), such as Verilog or Very High Speed Integrated Circuit (VHSIC) HDL (VHDL), for example. The component building unit 220 includes a parameterization unit 222. For components having parameter values that may be selected, the parameterization unit 222 generates graphical user interfaces to allow the user to enter appropriate values for the parameters. According to an embodiment of the present invention, parameters for a component may specify a number of bits of data to be processed by the component, a number of inputs or outputs of the component, and/or other parameters related to the component.

The system level EDA tool 200 includes a library unit 230. The library unit 230 stores components that may be selected by a user to be used in a system design. The components may include off the shelf components or custom designed components. The components may include, for example, processors, peripheral expansion devices, and bus interfaces. The components may also be configured to perform various math, logic and bit, communications, signal processing, video and image processing operations. Custom designed components that have been processed by the component building unit 220 may be stored in the library unit 230.

The system level EDA tool 200 includes a system generation unit 240. When a system design is completed, the system generation unit 240 may be used to convert the system design into HDL. The system generation unit 240 may also operate to save or write the system design to an appropriate location.

Figure 3:
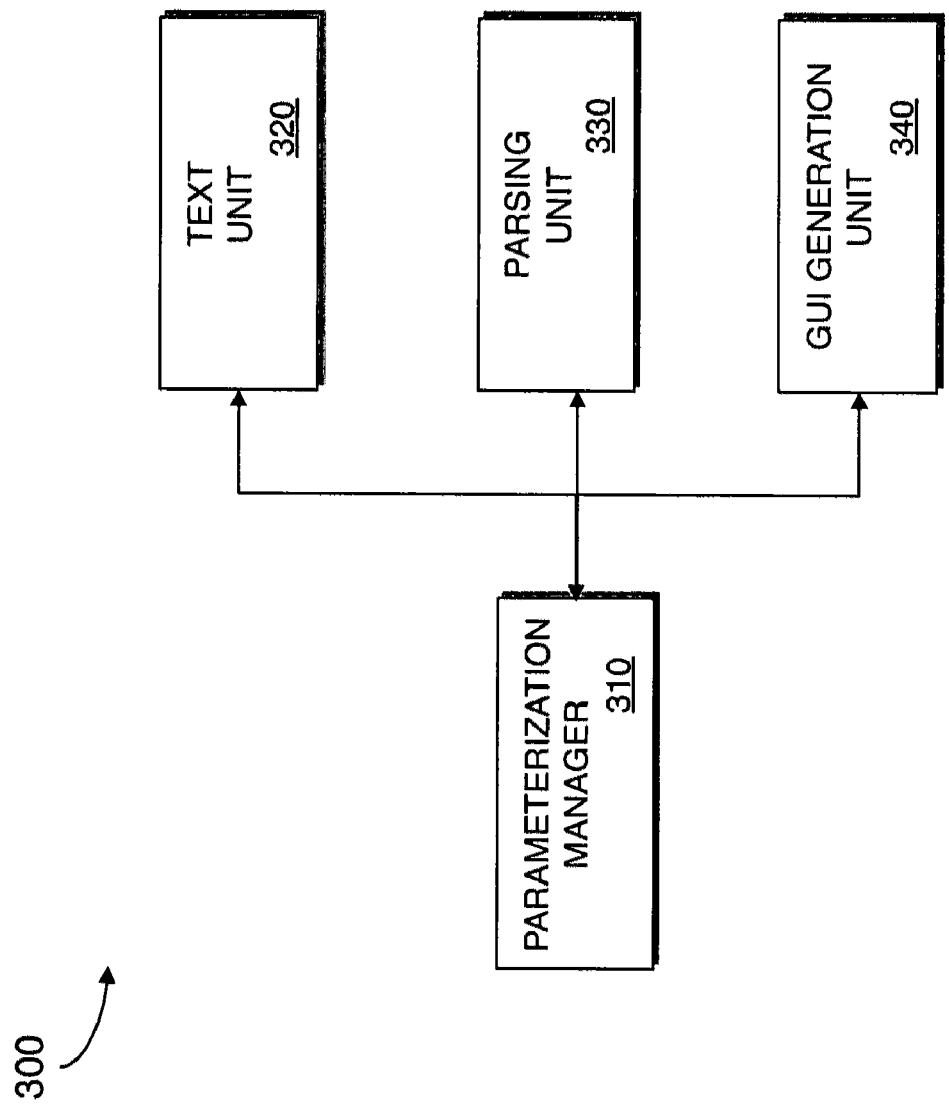
FIG. 3 illustrates a block diagram of a parameterization unit according to an embodiment of the present invention.

FIG. 3 illustrates a block diagram of a parameterization unit 300 according to an embodiment of the present invention. The parameterization unit 300 may be used to implement the parameterization unit 222 shown in FIG. 2. The parameterization unit 300 includes a parameterization manager 310. The parameterization manager 310 is connected to and transmits information between units in the parameterization unit 300.

The parameterization unit 300 includes a text unit 320. The text unit 320 receives a component written in HDL and generates a text description of the component. According to an embodiment of the parameterization unit 300, the text unit 310 generates a file that is in an Extensible Markup Language (XML) format.

The parameterization unit 300 includes a parsing unit 330. The parsing unit 330 parses through the text description of the component for name and data types to identify parameters in the component. The parsing unit 330 may also select which parameters from the identified parameters to present in a graphical user interface. According to an embodiment of the present invention, the parsing unit 330 may compare the identified parameters with pre-defined parameters in a list to make the selection. Alternatively, the parsing unit 330 may solicit input from the designer of the component as to which parameters to select to present in the graphical user interface. As a default, the parsing unit 330 may select all parameters identified to present in the graphical user interface.

The parameterization unit 300 includes a graphical user interface (GUI) generation unit 340. The graphical user interface generation unit 340 creates a graphical user interface to allow a user to enter values for each of the parameters selected by the parsing unit 330. The graphical user interface generation unit 340 may use any appropriate technique to provide text fields, check boxes, pop-ups, and/or other graphical user interface tools to generate a graphical user interface. According to an embodiment of the parameterization unit 300, the graphical user interface generation unit 340 creates a script base graphical user interface description.

Figure 4:
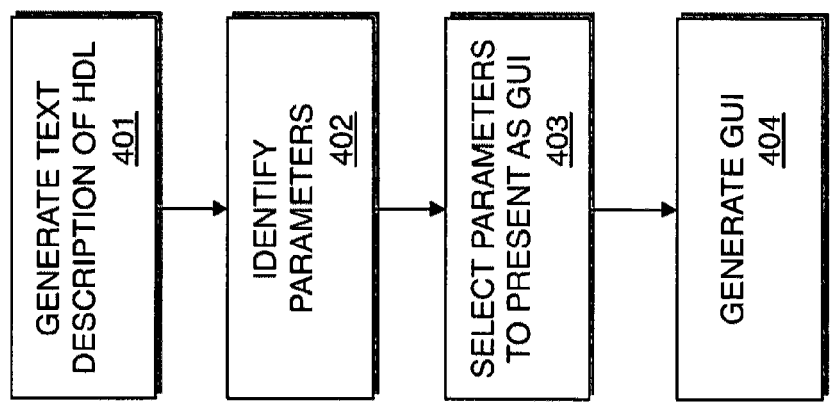
FIG. 4 is a flow chart illustrating a method for parameterizing hardware description language code in a system level design environment according to an embodiment of the present invention.

FIG. 4 is a flow chart illustrating a method for parameterizing hardware description language code in a system level design environment according to an embodiment of the present invention. At 401, a text description of the hardware description language code of a component is generated. According to an embodiment of the present invention, the text description may be in a XML format.

At 402, the text description is parsed to identify parameters. According to an embodiment of the present invention, the text description is parsed for name and data types to identify the parameters.

At 403, parameters are selected from the identified parameters to present in a graphical user interface. According to an embodiment of the present invention, parameters may be selected by comparing the identified parameters to a list of pre-defined parameters. Alternatively, parameters may be selected in response to selections made by a creator of the component. As a default, all the identified parameters may be selected.

At 404, a graphical user interface is generated to allow the entering of values for each of the selected parameters. The graphical user interface may use any appropriate technique to provide text fields, check boxes, pop-ups, and/or other graphical user interface tools to generate the graphical user interface. According to an embodiment of the present invention, a script base graphical user interface description is created.

FIG. 4 is a flow chart illustrating a method for parameterizing hardware description language code in a system level design environment according to an embodiment of the present invention. Some of the techniques illustrated in this figure may be performed sequentially, in parallel or in an order other than that which is described. It should be appreciated that not all of the techniques described are required to be performed, that additional techniques may be added, and that some of the illustrated techniques may be substituted with other techniques.

Figure 5:
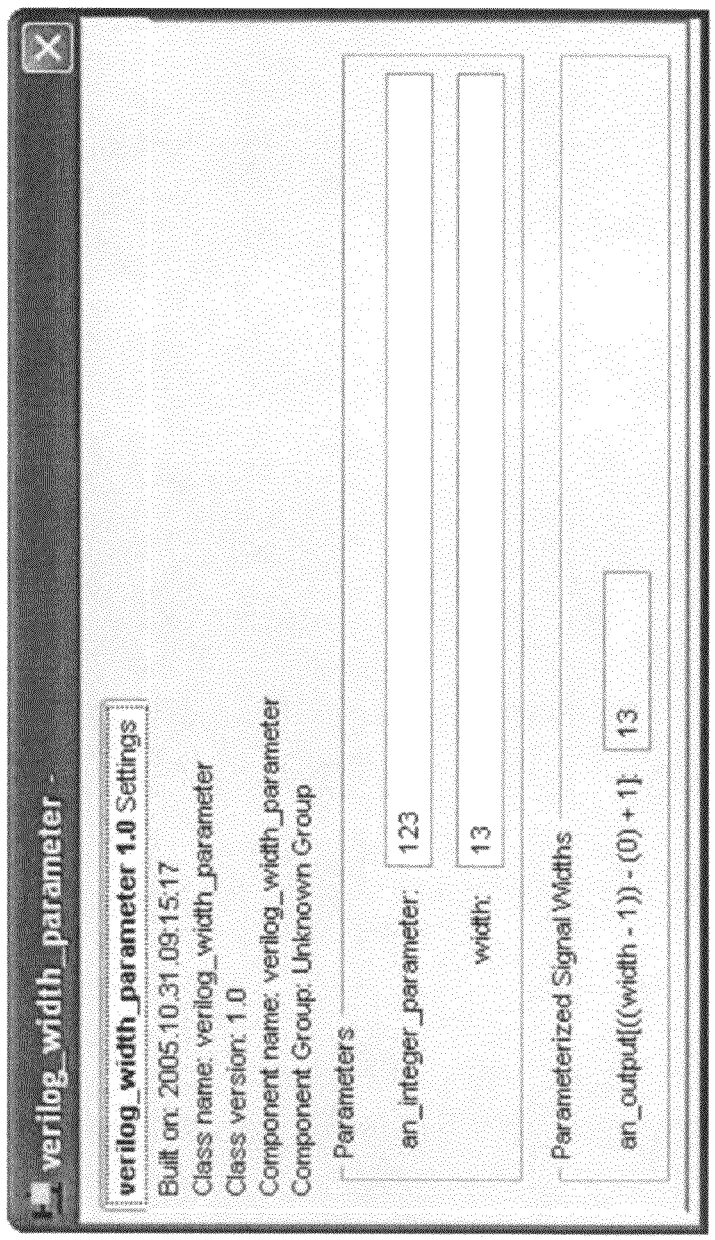
FIG. 5 illustrates a graphical user interface created by a component building unit according to an embodiment of the present invention.

FIG. 5 illustrates a graphical user interface created by a component building unit according to an embodiment of the present invention.

Embodiments of the present invention may be provided as a computer program product, or software, or firmware that may include an article of manufacture on a machine accessible or a machine-readable medium having instructions. The instructions on the machine accessible medium may be used to program a computer system or other electronic device. The machine accessible medium may include, but is not limited to, floppy diskettes, optical disks, CD-ROMs, magneto-optical disks, or other type of media/machine accessible medium suitable for storing or transmitting electronic instructions. The techniques described herein are not limited to any particular software configuration. They may find applicability in any computing or processing environment. The term "machine accessible medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, firmware and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A non-transitory computer-readable medium including sequence of instructions, the sequence of instructions including instructions which when executed by a computer system cause the computer system to perform a method, the method comprising:
   importing a component external from a system level EDA tool having a library into the system level EDA tool;
   translating code for the component into a text description;
   parsing the text description for name and data type to identify parameters;
   identifying selected parameters from the identified parameters in response to input from a designer of the component; and
   generating a graphical user interface from code of the component imported that allows a user to enter values for the selected parameters of the component.

2. The non-transitory computer-readable medium of claim 1, wherein the code for the component is written in a hardware description language.

3. The non-transitory computer-readable medium of claim 1, wherein identifying the selected parameters comprises comparing the identified parameters with a list of pre-defined parameters.

4. The non-transitory computer-readable medium of claim 1, wherein generating the graphical user interface comprises creating a script based description.

5. The non-transitory computer-readable medium of claim 1, wherein the identified parameters of the component specify a number of bits for data processed by the component.

6. The non-transitory computer-readable medium of claim 1, wherein the parameters of the component specify one of a number of inputs and outputs of the component.

7. The non-transitory computer-readable medium of claim 1, wherein the GUI includes a text field to allow the user to enter values for the selected parameters of the component.

8. The non-transitory computer-readable medium of claim 1, wherein the GUI includes a check box to allow the user to enter values for the selected parameters of the component.

9. The non-transitory computer-readable medium of claim 1, wherein the GUI includes pop-ups to allow the user to enter values for the selected parameters of the component.

10. A method for managing a system level electronic design automation (EDA) tool, comprising:
    importing a component external from the system level EDA tool into the system level EDA tool;
    translating code for the component into a text description;
    parsing the text description for name and data type to identify parameters;
    identifying selected parameters from the identified parameters in response to input from a designer of the component; and
    generating a graphical user interface from code of the component that allows a user to enter values for the selected parameters of the component, wherein at least one of the importing, translating, parsing, identifying, and generating is performed by a processor.

11. The method of claim 10, wherein the code for the component is written in a hardware description language.

12. The method of claim 10 further comprising comparing the identified parameters with a list of pre-defined parameters to further identify selected parameters.

13. The method of claim 10, wherein generating the graphical user interface comprises creating a script based description.

14. The method of claim 10, wherein the parameters of the component specify a number of bits for data processed by the component.

15. The method of claim 10, wherein the parameters of the component specify one of a number of inputs and outputs of the component.

16. The method of claim 10, wherein the GUI includes a text field to allow the user to enter values for the selected parameters of the component.

17. The method of claim 10, wherein the GUI includes a check box to allow the user to enter values for the selected parameters of the component.

18. The method of claim 10, wherein the GUI includes pop-ups to allow the user to enter values for the selected parameters of the component.

19. A component building unit in a system level electronic design automation (EDA) tool, comprising:

a component import unit that imports a component external from the system level EDA tool into the system level EDA tool; and a parameterization unit that includes a text unit that translates code for the component into a text description, a parsing unit that identifies selected parameters in response to input from a designer of the component, and a graphical user interface (GUI) generation unit that generates a graphical user interface from code of the component that allows a user to enter values for the selected parameters of the component.

20. The apparatus of claim 19, wherein the system level EDA tool further comprises:

a library unit to store the component with a plurality of other components; and a graphical editor unit to allow a user to select components from the library to implement in a system level design.

* * * * *